United States Patent
Byatt et al.

[11] Patent Number: 5,418,834
[45] Date of Patent: May 23, 1995

[54] MAINTENANCE TERMINATION UNITS

[76] Inventors: Stephen W. Byatt, 8 Manor Close, Bromham Bedford, United Kingdom, MK43 8JA; Michael J. Maytum, 30 Church Road, Willington Bedford Beds, United Kingdom, MK44 3QB

[21] Appl. No.: 119,923
[22] Filed: Sep. 10, 1993
[30] Foreign Application Priority Data
Nov. 5, 1992 [GB] United Kingdom ............... 9223143
[51] Int. Cl.6 ................. H04M 1/24; H01L 27/06; H03K 17/74
[52] U.S. Cl. ................. 379/26; 379/399; 327/484
[58] Field of Search ............ 379/399, 398, 29, 26, 379/30, 22, 412, 201; 307/256

[56] References Cited
U.S. PATENT DOCUMENTS

| | | | |
|---|---|---|---|
| 4,041,332 | 8/1977 | Ohhinata | 307/639 |
| 4,396,809 | 8/1983 | Brunssen | 379/201 |
| 4,653,084 | 3/1987 | Ahuja | 379/29 |
| 4,700,380 | 10/1987 | Ahuja | 379/177 |
| 4,710,949 | 12/1987 | Ahuja | 379/26 |
| 5,146,384 | 9/1992 | Morkovic et al. | 361/55 |
| 5,175,662 | 12/1992 | DeBalko et al. | 361/119 |

FOREIGN PATENT DOCUMENTS 2533333 6/1976 Germany.
2221088 1/1990 United Kingdom.

*Primary Examiner*—Stephen Chin
*Assistant Examiner*—Kevin Kim
*Attorney, Agent, or Firm*—Russell E. Baumann; Richard L. Donaldson; René E. Grossman

[57] ABSTRACT

This invention describes a maintenance termination unit often used in telephone lines and particularly the triggering circuit for use in such units. The triggering circuit uses two complementary transistors Q1, Q2 and a diode Z1 along with a resistor R and capacitor C2 in specific electrical connection sequence to provide for "turn-on" by either reaching the preset "turn on" voltage or by having a significantly high rate of voltage rise.

6 Claims, 2 Drawing Sheets

MAINTENANCE TERMINATION UNITS

BACKGROUND OF THE INVENTION

This invention relates to a Maintenance Termination Unit (or MTU) for use, particularly but not exclusively, in telephone lines.

Typically, a Maintenance Termination Unit or an MTU is specified as having two Voltage Sensitive Switches, VSS1 and VSS2, one in each telephone line wire a and b, and a Distinctive Termination Unit connected between the line wires on the subscribers side (equipment side) of the MTU. A diagrammatical example of such an MTU is shown in FIG. 1 of the accompanying drawings.

Much of the functionality and many of the parameter values of the Voltage Sensitive Switches are dictated by industry accepted standard specifications. In terms of switching voltage there are maximum and minimum limits. Typically, the lower level of the switching voltage is about 16 V. That is, the Voltage Sensitive Switches must not switch at DC voltages below this 16 V level. A maximum limit to the switching voltage comes from "off hook service request" conditions. Such a value is typically 37.0 V or 18.5 V per switch. Based upon the above-mentioned minimum and maximum voltage limits, the nominal switch voltage is 17.3 V with 7% tolerance.

Further, to service certain telephone features (i.e., retaining stored numbers) a minimum level of direct current must be passed by the Voltage Sensitive Switches at voltages below the minimum switching voltage. This current is normally provided by a resistive shunt path. A resistive path of several megaohms is needed to supply sufficient current in the "on-hook idle state" condition.

In practice, there is only a limited range of current available to switch the voltage sensitive switches, and this current is affected by variations in temperature. At −40° C. the maximum value is about 75 microamperes and the minimum value is 20 microamperes, after subtracting the resistive component. The corresponding values at +70° C. are 50 microamperes and 2 microamperes respectively. That is, temperature greatly effects current available to cause switching.

Once the Voltage Sensitive Switch has switched into the "on-state", the "on-state" voltage drop must not exceed certain maximum values. Such values are typically 1 V at 20 mA, 1.25 V at 25 mA and 1.5 V at 30 mA. The lowest specified value of line current when the switch is in the "on-state" is 10 mA which occurs in the "return loss" condition. This 10 mA current represents the maximum value of switch holding current to maintain the switch in the "on-state" condition.

Still further, extra components are added to the MTU to facilitate line diagnostics/testing. Typically, there are added two series connected resistor and capacitor networks (see FIG. 2) which are connected between the incoming and outgoing wire to the equipment. This network and the voltage sensitive switch function create a relaxation oscillator. To ensure that the relaxation oscillator does not stop oscillating at the highest current available, the holding current must be greater than 1 mA.

In view of these conditions set forth above, the holding current must be in the range of 1 to 10 mA.

In addition to the normal service tests required, there are some stress tests involving surge and power cross that are also detailed in the standards. These state that the Voltage Sensitive Switch should be undamaged by surges of 9A for 10/360 microseconds and 6A for 10/1000 microseconds. Fusing requirements of the Voltage Sensitive Switch are also delineated and determined by AC fire hazard requirements.

In summary, there are many and varied standard specifications for the MTU with a typical circuit for such device of the prior art being shown in FIG. 2.

Referring to FIG. 2, the triggering function and the triac (Q1), resistor (R1) and capacitor (C1) form the relaxation oscillator circuit as required for line diagnostics/testing; fuse (F1) allows compliance with AC fire hazard requirements; and resistor (R2) in conjunction with Resistor (R1) provides the resistive path necessary for "on-hook idle state" condition.

A triac such as a Texas Instruments TICP206 device can be selected to have holding current, on-state voltage drop, surge and continuous AC rating all in compliance with the standards.

The major design problem with the Voltage Sensitive Switch is the solution of the triggering function. It has already been noted that the operating temperature range causes the switching voltage and current windows to be very small, thereby making the component selection for the triggering function extremely difficult without incurring high cost.

One solution to this problem is described in the U.S. Pat. No. 4,396,809, and is a discrete component solution for the triggering function. This is shown generally in FIG. 3.

An unidirectional trigger circuit is formed by resistors (R1) and (R2), transistors (Q1) and (Q2) and reference zener diode (Z1). The triggering voltage for this circuit will be given by the sum of the zener voltage and Vbe (base-emitter voltage) of transistor (Q1). Resistor (R1) controls the triggering current and resistor (R2) removes false triggering due to leakage currents. At currents above the triggering current, both transistors (Q1) and (Q2) become active and form a regenerative pair and switch on developing a total voltage drop of about 0.8 V across the transistor pair. The diode bridge comprising diodes (D1), (D2), (D3) and (D4) allows the unidirectional circuit to function in a bidirectional manner. The inclusion of the diode bridge does not change the triggering current level, but increases the triggering and on-state voltage by the sum of the forward voltage drops of diodes (D1) and (D4) or (D2) and (D3) depending on polarity.

The resultant circuit depends on the tolerancing of two components for the triggering current and six components for the triggering voltage (four components for each polarity). In an attempt to simplify and cost reduce this circuit, there have been several proposals to replace it with available multi-layer semiconductor devices. Simple avalanche devices like back to back zener diodes are not suitable for this application as there is insufficient current available to directly trigger the triac. Some form of break back or crow-bar action is required to discharge some of the capacitor (C1) energy into the triac gate at a high enough level to cause triac triggering. For this reason, proposals have been made to use break back and crow-bar devices such as DIACS and SIDACS.

DIACS and SIDACS are not readily available in the voltage window needed for MTU operation. Such devices would be difficult to manufacture with the appropriate parameters.

Another potential problem occurs during stress testing when the triggering function has to switch the rapidly rising surge current. The discrete solution described above would need to incorporate heavier duty components to withstand the surge stress and to avoid failure which would increase the cost.

In addition, the original unidirectional switch (without diode bridge) is not suitable for antiparallel connection. Resistor (R1), in conjunction with the forward biassed reference diode, would create an excessive shunt current path when the unidirectional switch was reverse biased.

Removing resistor R1 can reduce this problem. However, the component tolerancing then becomes much more critical on triggering current. Previously, the triggering current could be defined as: Vbe(Q1)/R1. In removing (R1) the triggering current becomes Vbe(Q1)/R2hFE(Q1). The new factor of hFE(Q1) means that the design of transistor Q1 in terms of hFE is very critical to the resultant triggering current.

SUMMARY OF THE INVENTION

An object of the present invention is to provide an MTU which overcomes the disadvantages of known MTU circuits. According to one aspect of the present invention, there is provided a triggering circuit for a maintenance termination unit including first and second transistors in which the base of the first transistor is connected to the collector of the second transistor to form a first connection and the base of the second transistor is connected to the collector of the first transistor to form a second connection; a diode connected between the first and second connections; a resistor connected between the base and emitter of one of the transistors; and a capacitor also connected between the first and second connections.

BRIEF DESCRIPTION OF THE DRAWINGS

Reference will now be made, by way of example, to the accompanying drawings in which.

DESCRIPTION OF THE PREFERRED EMBODIMENTS

Figure 1:
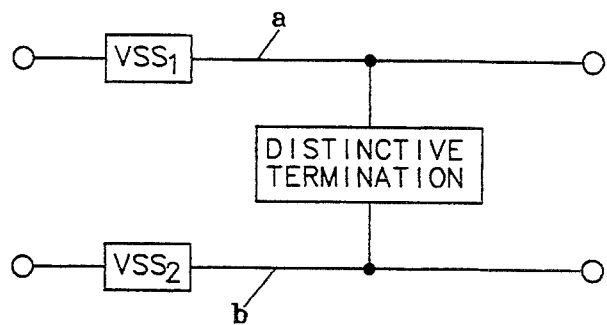
FIG. 1 is a schematic diagram of an MTU function.
Figure 2:
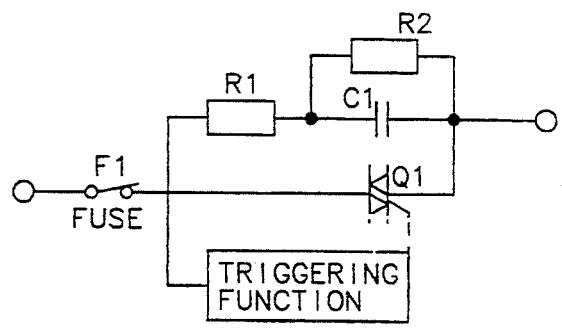
FIG. 2 is a circuit diagram of a typical prior art MTU circuit.
Figure 3:
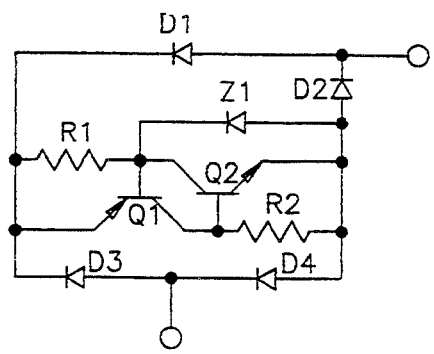
FIG. 3 is a circuit diagram of a prior art triggering circuit for an MTU.
Figure 4:
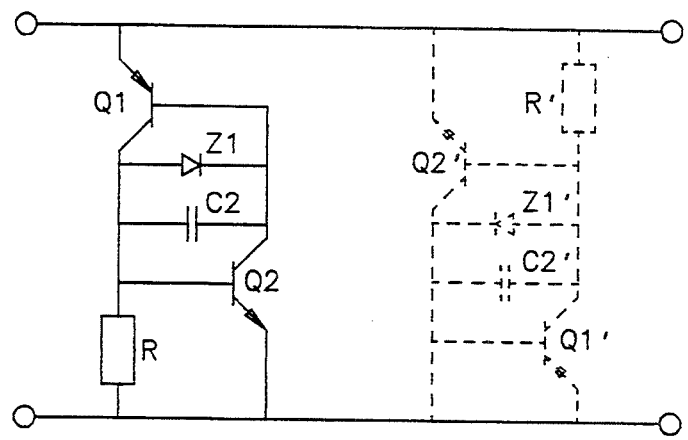
FIG. 4 is a circuit diagram of a triggering circuit for an MTU of the present invention.
Figure 5:
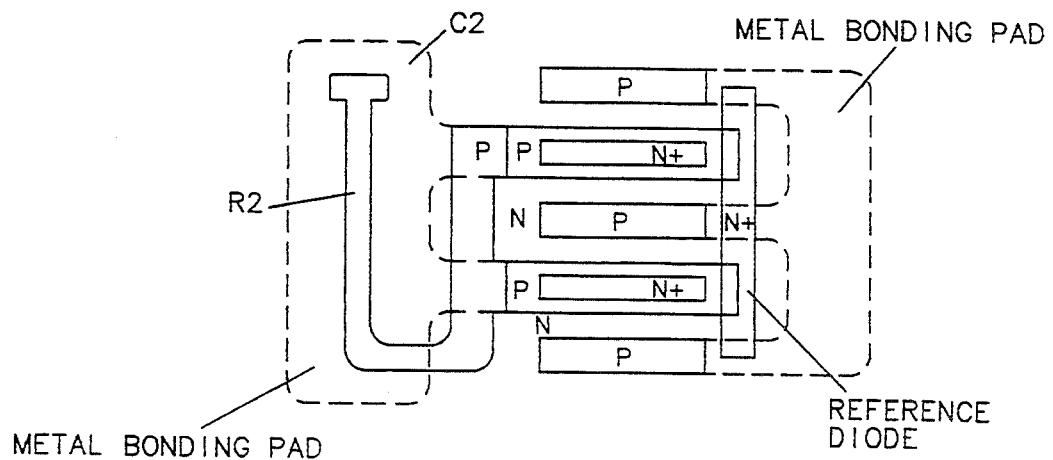
FIG. 5 is a top view of a silicon layout of one unidirectional circuit of FIG. 4.

The foregoing problems of the prior art have been overcome by the triggering structure of this invention which is shown in FIG. 4, and is in the form of a developed unidirectional voltage triggered circuit. The circuit is made up of transistors Q1 and Q2, resistor R and reference diode Z1. Further, due to the method of implementation, it is possible to make a second circuit on the same silicon which can be connected in antiparallel with the first circuit giving a bidirectional trigger capability on a single chip. This second circuit is shown in dotted lines in FIG. 4.

The circuit implementation allows the hFE (current gain) of (Q1) and the value of resistor (R) to be set accurately. A further modification over the prior art is that the reference diode circuit is connected to the base of transistor (Q2) to increase the base current and dilute the effects of hFE change in transistor Q1.

Further, the design is optimized to incorporate the appropriate value of capacitance (C2) across the collector base of transistor (Q1). When a rapidly rising voltage is applied to the trigger circuit and the voltage exceeds the Vbe of transistor (Q1), transistor (Q1) amplifies the displacement current of capacitor (C2) by hFE(Q1). This provides a second mechanism for triggering the transistor pair into the on-state. This second triggering function can be described as turn-on caused by the rate of voltage rise (dv/dt).

By designing the trigger function to turn-on with dv/dt values of about greater than for example 5 V/microsecond, MTU operational wave forms can be greatly improved. That is, Dial-Pulse distortion is significantly reduced as the MTU turns on with only a few volts across it. If this dv/dt effect did not happen, the MTU would have to develop the full triggering voltage (about 17 V) in each wire before it switched. To do this, the relaxation oscillator capacitor would have to charge to 17 V which represents a considerable time delay thereby causing a large amount of dial pulse distortion (i.e., rounding of square wave form).

In order to develop sufficient dv/dt, the value of the resistor in series with the oscillation capacitor must not be too small. A value of greater than 100 ohms is usually sufficient. This change to the operation of the triggering circuit does not effect any of the other functions required of the MTU circuit.

As both positive and negative triggering circuits are manufactured concurrently on the same chip, they are extremely well matched for switching voltage and current. The switching voltage will be the sum of the Vbe for transistor (Q1) and the Vbe for transistor (Q2) and the reference voltage of (Z1). An important feature of the implementation is that the reference voltage is controlled by two diffusions and not by the starting silicon. This means the switching voltage can be controlled by processing to be positioned within the MTU requirement window.

The switching current level (base emitter voltage) is controlled by the value of Resistor (R) (set by mask design and doping level); the Vbe of transistor (Q2); and the hFE of (Q1). For given layout design, the switching current can be controlled by the doping level of Resistor R.

Partial compensation for the zener voltage increase with temperature is given by the decrease in the Vbe of transistor (Q1) and the Vbe transistor (Q2).

The particular embodiment shown may have a number of variations as long as the essential features of the circuit are maintained. The triggering circuit is suitable for use in any MTU's.

We claim:

1. A triggering circuit for a maintenance termination unit including first and second complementary transistors in which the base of the first transistor is connected to the collector of the second transistor to form a first connection and the base of the second transistor is connected to be collector of the first transistor to form a second connection, and a diode connected between the first and second connections; the improving comprising a resistor connected between the base and the emitter of one of the transistors and a capacitor connected between the first and second connections, wherein said diode determines the voltage level at which said triggering circuit switches into the "on-state" and said capacitor enables switching at voltage values below that set by said diode when a voltage rate of rise to the triggering circuit is rapid to significantly reduce dial pulse distortion by having true wave forms.

2. The triggering circuit according to claim 1 wherein said first and second complementary transistors are PNP and NPN transistors with said diode poled such that the diode cathode connects to the base of the PNP transistor.

3. A triggering circuit according to claim 1 wherein the current switching level of said trigger current is controlled by the value of said resistor, the base emitter voltage of the second transistor and the current gain of the first transistor.

4. A trigger circuit according to claim 1 wherein the rapid rate of voltage rise is at least about 5 V/microsecond.

5. A bidirectional trigger circuit comprising two triggering circuits according to claim 1 and connected in antiparallel with the other.

6. A maintenance termination unit including bidirectional triggering circuit according to claim 5.

* * * * *